United States Patent [19]

Kimura et al.

[11] Patent Number: 5,688,321
[45] Date of Patent: Nov. 18, 1997

[54] APPARATUS FOR PRODUCING A SILICON SINGLE CRYSTAL BY A FLOAT-ZONE METHOD

[75] Inventors: Masanori Kimura; Hirotoshi Yamagishi, both of Annaka, Japan

[73] Assignee: Shin-Etsu Handotai Co., Ltd., Tokyo, Japan

[21] Appl. No.: 636,348

[22] Filed: Apr. 23, 1996

Related U.S. Application Data

[62] Division of Ser. No. 260,919, Jun. 15, 1994, Pat. No. 5,556,461.

[30] Foreign Application Priority Data

Jun. 18, 1993 [JP] Japan .................... 5-147231

[51] Int. Cl.$^6$ .................................................. C30B 35/00
[52] U.S. Cl. .......................... 117/200; 117/49; 117/51; 117/52
[58] Field of Search .................... 117/3, 49, 51, 117/52, 200, 201, 204

[56] References Cited

U.S. PATENT DOCUMENTS

| 5,089,082 | 2/1992 | Dreier et al. . |
| 5,114,528 | 5/1992 | Kou . |

FOREIGN PATENT DOCUMENTS

| 0142666A3 | 5/1985 | European Pat. Off. . |
| 0345618A2 | 12/1989 | European Pat. Off. . |
| 0445036A1 | 9/1991 | European Pat. Off. . |
| 0504929A1 | 9/1992 | European Pat. Off. . |
| 1021992 | 1/1986 | Japan . |
| 3274865 | 11/1988 | Japan . |
| 5043377A | 2/1993 | Japan . |
| WO86/04619 | 8/1986 | WIPO . |

OTHER PUBLICATIONS

Japanese Abstract No. 63-274685, "Device For Producing Single Crystal By Infrared Heating", Nov. 11, 1988.

2300 Journal of Crystal Growth 128 (1993) pp. 282–287, Mar. I, Nos. 1/4, Amsterdam, NL, "Facet formation in silicon single crystals grown by VMFZ method," M. Kimura et al.

*Primary Examiner*—Felisa Garrett
*Attorney, Agent, or Firm*—Nikaido Marmelstein Murray & Oram LLP

[57] ABSTRACT

A method of producing a silicon single crystal by the floating-zone method, comprising the steps of: providing a polysilicon rod having an average grain length of 10 to 1000 µm; heating a portion of the polysilicon rod to form a molten zone while applying a magnetic field of 300 to 1000 gauss to the molten zone; and passing the molten zone through the length of the polysilicon rod thereby the polysilicon rod is converted into a silicon single crystal ingot through a one-pass zoning of the floating zone method. An apparatus for reducing the method into practice is also described. The growing single crystal ingot is post-heated by a heat reflector near the molten zone.

9 Claims, 3 Drawing Sheets

APPARATUS FOR PRODUCING A SILICON SINGLE CRYSTAL BY A FLOAT-ZONE METHOD

This is a division of application Ser. No. 08/260,919 filed Jun. 15, 1994, now U.S. Pat. No. 5,556,461.

BACKGROUND OF THE INVENTION

1. Field of the Invention

The present invention relates generally to high-purity silicon single crystal growth method and apparatus, and more particularly to a method of and an apparatus for producing a single crystal from a polysilicon rod by a one-pass zoning of the floating-zone (FZ) method.

2. Description of the Prior Art

The FZ method and the Czochralski (CZ) method have been used as methods of growing single crystals of silicon. The FZ method, due to its capability of growing high purity silicon single crystals with little contamination of oxygen and others than ones grown by the CZ method, is particularly useful to produce high resistivity silicon single crystals for fabricating high-power semiconductor devices.

In the production of a silicon single crystal by the FZ method, a polysilicon rod is used as a raw material. The polysilicon rod is produced from trichlorosilane deposited on a silicon core rod in vapor phase to such an extent that the grown polysilicon has an average grain length of 10 to 1000 μm. To grow a single crystal, one end of the polysilicon rod is shaped into a conical form and the tip of the conical end is melted and fused with a seed crystal. Then, polysilicon rod and the seed crystal are united together while eliminating dislocations by forming a bottle neck. A silicon single crystal is grown by recrystallizing molten silicon. The molten zone, formed by heating the polysilicon rod partially with an annular induction heating coil, is passed from the seeded end of the polysilicon rod to the other end by moving down the polysilicon rod and the grown single crystal simultaneosly relative to the induction heating coil, while rotating the polysilicon rod and the grown single crystal with a concentric or an eccentric mode.

According to the prior FZ method, production of silicon single crystals by a one-pass zoning is hardly achievable. Accordingly, the conventional FZ method for producing the silicon single crystals requires a two-pass zoning, i.e., the "pre-zoning" and "dislocation-free zoning". At the first zoning of the FZ method, called "pre-zoning", an intermediate polysilicon rod is formed, and at a the succeeding FZ growth run, called "dislocation-free zoning", the intermediate polysilicon rod is converted into a silicon single crystal ingot. It is ineffective for silicon single crystal production to apply the two-pass zoning process.

SUMMARY OF THE INVENTION

With the foregoing drawback of the prior art in view, it is an object of the present invention to provide a method of and an apparatus for producing a dislocation-free silicon single crystal by a one-pass zoning of the FZ method.

To attain the foregoing object, the invention provides a method of producing a silicon single crystal by the floating-zone method, comprising the steps of: providing a polysilicon rod having an average grain length of 10 to 1000 μm; heating a portion of the polysilicon rod to form a molten zone while applying a magnetic field of 300 to 1000 gauss to the molten zone; and passing the molten zone through the length of the polysilicon rod, thereby converting the polysilicon rod into a silicon single crystal ingot through a one-pass zoning of the floating zone method.

It is preferable during the one-pass zoning that a solid-liquid interface between the polysilicon rod and the molten zone is held at a level equal or higher than the underside of an induction heating coil. A further advantageous result can be obtained by post-heating the silicon single crystal being grown.

The present invention further provides an apparatus used for reducing the method into practice, which apparatus includes a vertical magnetic field forming means and/or a horizontal magnetic field forming means disposed on either one or both of upper and lower sides of the molten zone, and applied in surrounding relation to the molten zone for forming either one or both of a horizontal magnetic field acting in a direction normal to an axis of the polysilicon rod, and a vertical magnetic field acting a direction parallel to the axis of the polysilicon rod.

The vertical magnetic field forming means and the horizontal magnetic field forming means comprise a solenoid coil excited by a direct current.

The above and other objects, features and advantages of the present invention will become manifest to those versed in the art upon making reference to the detailed description and the accompanying sheets of drawings in which preferred structural embodiments incorporating the principle of the present invention are shown by way of illustrative example.

DETAILED DESCRIPTION OF THE INVENTION

Through investigations and analyses, the present inventor came to a conclusion that the difficulty associated with the conventional FZ method in obtaining a silicon single crystal from a polysilicon rod having an average grain length of 10 to 1000 μm by a one-pass zoning (dislocation-free zoning only) is due to the behavior of polysilicon granules which fall off from the polysilicon rod into a melt, and come to a solid-liquid interface of the single crystal side before they are completely melted, thereby the polysilicon granules convert a growing single crystal into polycrystal. Based on this conclusion, various attempts were made to delay or retard the arrival of the polysilicon granules at the sold-liquid interface of the single crystal side.

Figure 4:
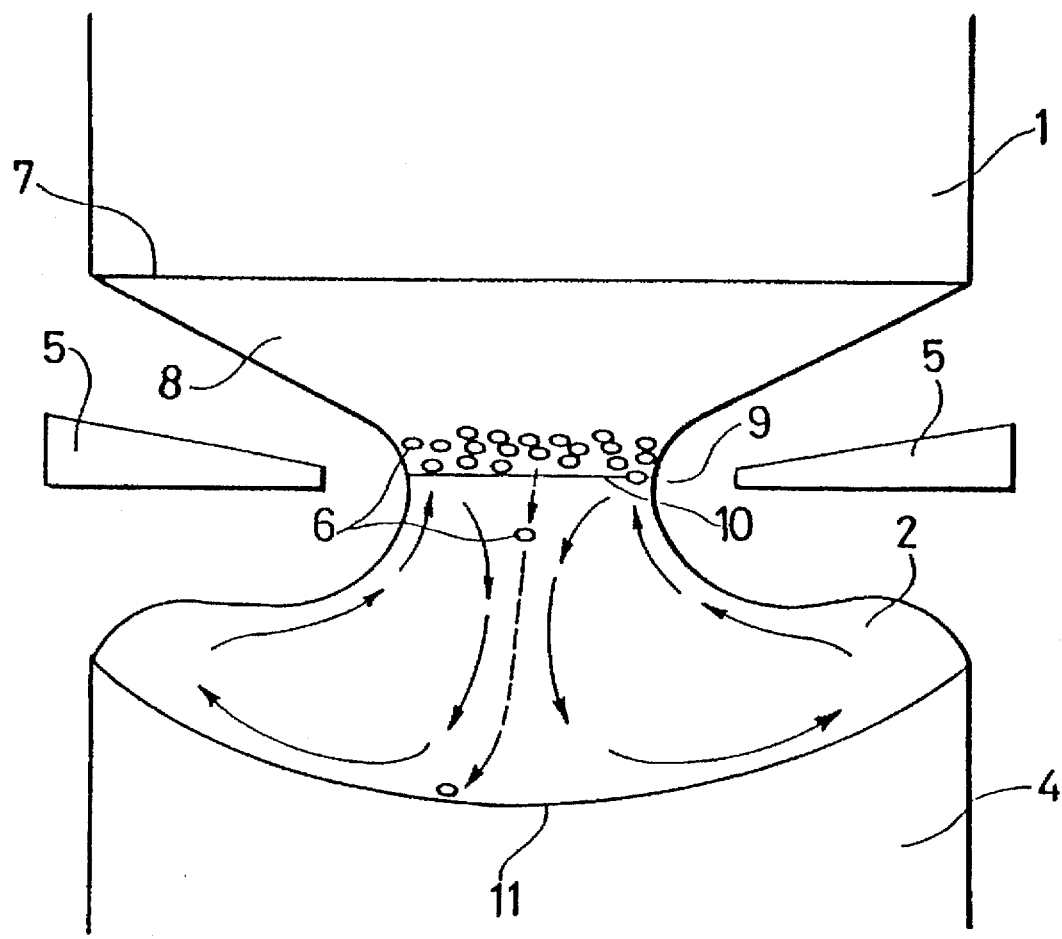
FIG. 4 is a diagrammatical view showing the behavior of polysilicon granules in a molten zone observed during crystal growth by the FZ method.

FIG. 4 diagrammatically shows the cross section of a molten zone formed in the body of a polysilicon rod 1. The grain length of the polysilicon rod 1 is very small. In general, the polysilicon rod which is made from trichlorosilane has an average grain length of 10 to 1000 μm.

In the FZ growth process, the front end 7 of the polysilicon rod 1 is heated by an induction heating coil 5 so that an outer peripheral surface 8 of the polysilicon rod 1 is melted. Polysilicon granules 6 which fall off from the outer peripheral surface 8 are completely melted, partly because the granules 6 are always heated with the induction heating coil 5, and partly because the granules 6 take a relatively long time to move through a relatively long distance between the outer peripheral surface 8 and a solid-liquid interface 11 of the single crystal side.

On the other hand, a melting neck portion 9 of the polysilicon rod 1 is contiguous to a molten zone 2 at another solid-liquid interface 10 of the polysilicon side, so that the neck portion 9 is melted by the heat transmitted from the melt. Polysilicon granules 6 fallen off from the melting neck portion 9, reach the solid-liquid interface 11 of the single crystal side before they are completely melted. This is partly because the distance between the melting neck portion 9 and the solid-liquid interface 11 of the single crystal side is relatively short, and partly because the polysilicon granules 6 make only a short trip as they are accelerated by convection flows descending through a central portion of the molten zone 2, as indicated by broken lines shown in FIG. 4. By the arrival of the polysilicon granules 6 at the solid-liquid interface 11 of the single crystal side, the silicon single crystal being grown is immediately converted into polycrystal.

To avoid the foregoing problem, the present invention employs a new method so that the convection flows in the melt are suppressed to enable the polysilicon granules 6 to float in the melt for a longer period of time, and the distance between the solid-liquid interface 10 of the polysilicon side and the solid-liquid interface 11 of the single crystal side is extended to enable the polysilicon granules 6 to travel through a longer distance in floating condition within the melt. With this new method, the poly-silicon granules 6 which fall off from the melting neck portion 9 into the melt, are completely melted before they reach the solid-liquid interface 11 of the single crystal side. The silicon single crystal being grown is, therefore, prevented from converting into polycrystal with the result that a silicon single crystal ingot 4 can be grown through a one-pass zoning of the FZ method.

The convection in the melt can be controlled or suppressed by applying a static magnetic field to the molten zone 2. Since the electrical conductivity of the silicon melt is high, the convection flow in the silicon melt is considerably suppressed by the Lorentz force when a static magnetic field is applied to the molten zone 2. The strength of the static magnetic field is preferably 300 to 1000 gauss. A static magnetic field of strength smaller than 300 gauss can only insufficiently suppress the convection in the silicon melt. Conversely, a static magnetic field having a strength in excess of 1000 gauss substantially inhibits the convection and the thermal conduction generated by the convection in the silicon melt, and eventually causes solidification of the melt, which consequently may deteriorate the shape and configuration of a silicon single crystal.

The static magnetic field to be applied to the molten zone 2 may be a vertical magnetic field or a horizontal magnetic field. Since the convection pattern in the silicon melt is always completed or closed within the molten zone 2, if a convection flow direction, either horizontal or vertical, is suppressed by a static magnetic field in the corresponding direction, the convection flows in any other direction can automatically be suppressed.

To provide a longer distance between the solid-liquid interface of the polysilicon side and the solid-liquid interface of the single crystal side, it is particularly effective to keep the solid-liquid interface 10 at a level above the underside of the induction heating coil 5 from the initial stage of formation of the molten zone 2. In this arrangement, a region directly below the solid-liquid interface 10 is effectively heated by the induction heating coil 5 so that the solid-liquid interface 10 of the polysilicon side is prevented from descending toward the solid-liquid interface 11 of the single crystalline side. In addition, the high heating efficiency raises the temperature of the molten zone 2, and enhances the melting speed of the polysilicon rod 1. In practice, the position of the solid-liquid interface 10 of the polysilicon side is adjusted by regulating the power supplied to the induction heating coil.

As an additional method to extend the distance between the solid-liquid interface 10 of the polysilicon side and the solid-liquid interface 11 of the single crystal side, the silicon single crystal 4 being grown is post-heated to descend the solid-liquid interface 11 of the single crystal side.

Figure 1:
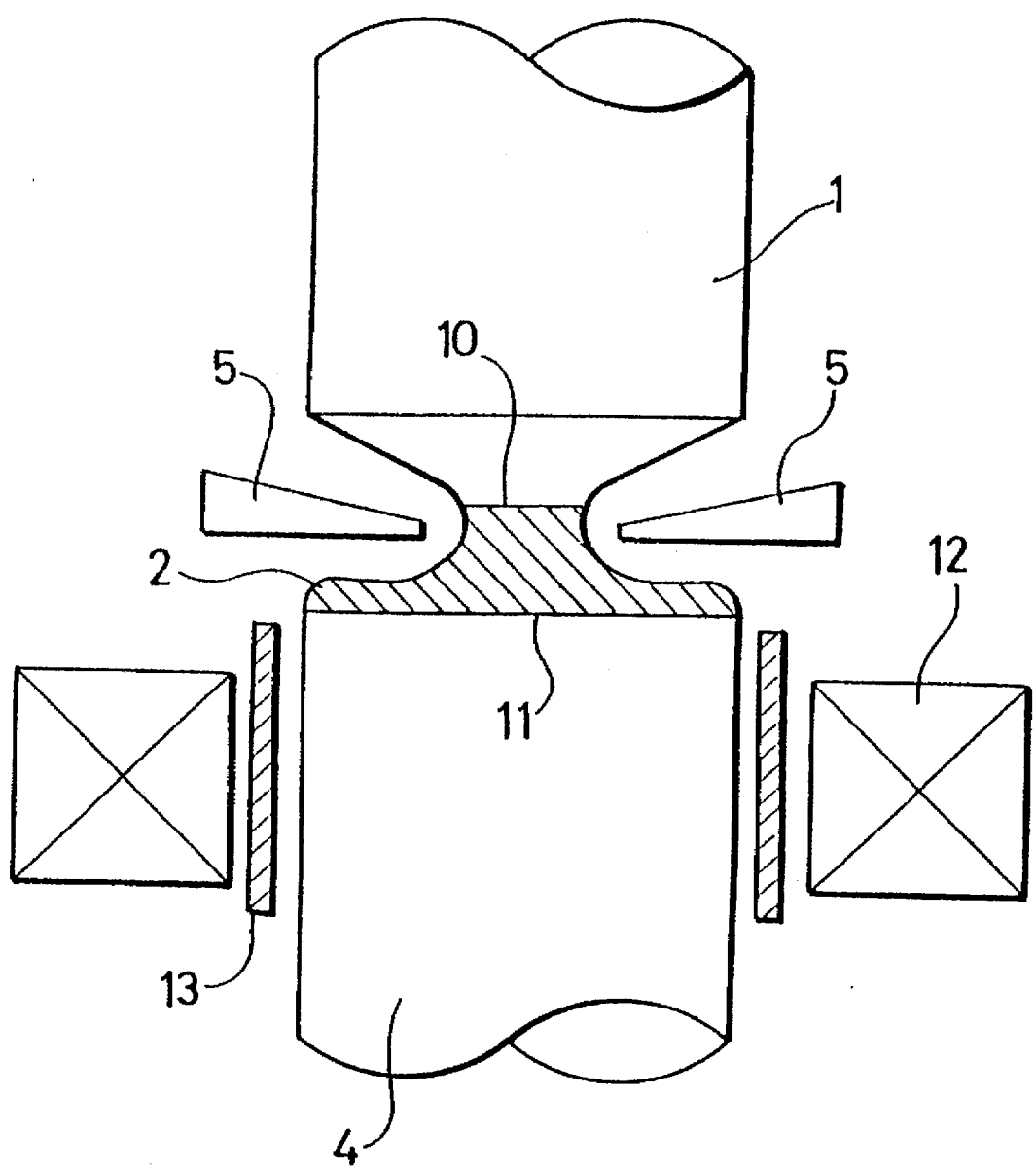
FIG. 1 is a diagrammatical view showing a silicon single crystal growth method according to the present invention.
Figure 2:
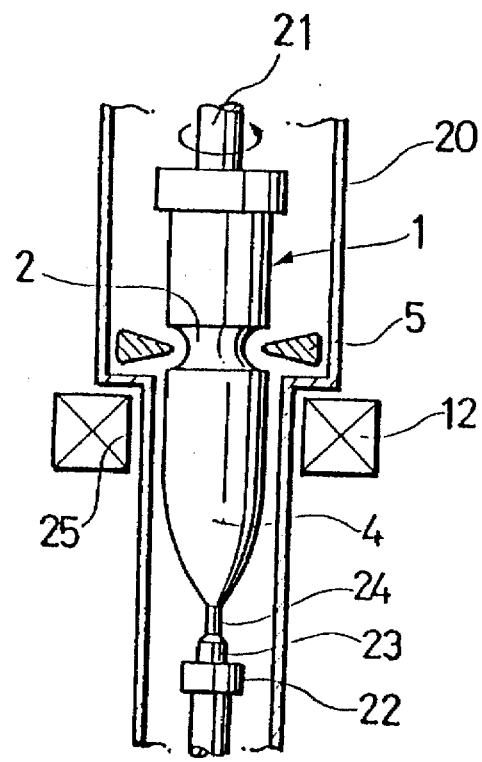
FIG. 2 is a diagrammatical vertical cross-sectional view showing the general construction of a silicon single crystal growth apparatus according to an embodiment of the present invention.
Figure 3:
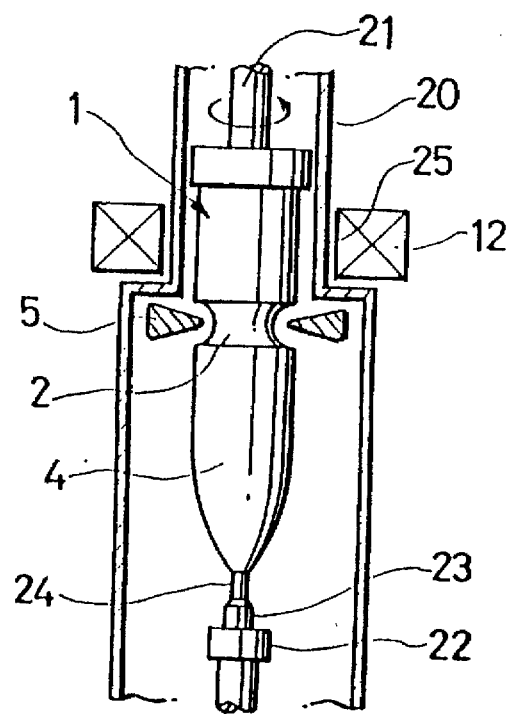
FIG. 3 is a view similar to FIG. 2, but showing an apparatus according to another embodiment.

Now, certain preferred embodiments of apparatus used for reducing the method of the invention into practice will be described below with reference to FIGS. 1 to 3, wherein FIG. 1 is a diagrammatical view showing a method for producing a silicon single crystal by a one-pass zoning of the FZ method according to the present invention, FIG. 2 is a diagrammatical cross-sectional view of an apparatus for reducing the method of the present invention, and FIG. 3 is a view similar to FIG. 2, showing an apparatus according to another embodiment.

As shown in FIG. 2, the silicon single crystal growth apparatus includes a chamber 20 in which an upper shaft 21 and a lower shaft 22 are disposed in vertical alignment with each other. The upper and lower shafts 21, 22 are rotatable about a common vertical axis and reciprocally movable in a vertical direction.

A polysilicon rod 1 having a predetermined diameter is attached to the upper shaft 21. A seed crystal 23 having a predetermined crystal orientation is attached to the lower shaft 22. The front end (lower end) of the polysilicon rod 1 is melted with heat generated by an annular or ring-shaped induction heating coil 5 and the melted front end is then fused with the seed crystal 23. The polysilicon rod 1 and the seed crystal 23 are united together while eliminating dislocations by forming a bottle neck 24. Subsequently, the molten zone 2, formed by heating the polysilicon rod 1 partially with the annular induction heating coil 5, is passed from the seeded end of the polysilicon rod 1 to the other end by moving down the polysilicon rod 1 and the grown single crystal 4 simultaneously relative to the induction heating coil 5, while rotating the polysilicon rod 1 and the grown single crystal 4 with a predetermined rate about a concentric mode. During that time, a single crystal 4 is doped by blowing a predetermined dopant gas onto the molten zone 2 within the chamber 20.

In order to provide a longer distance between the solid-liquid interface 10 (FIG. 1) of the polysilicon side and the solid-liquid interface 11 (FIG. 1) of the single crystal side, the solid-liquid interface 10 of the polysilicon side is held above the underside of the induction heating coil 5, and preferably a reflector 13 is disposed in surrounding relation to the silicon single crystal 4 being grown so as to post-heat the growing silicon single crystal 4, as shown in FIG. 1.

The chamber 20 is reduced in diameter at a portion extending below the induction heating coil 5 so as to form a reduced step portion 25. At the reduced step portion 25, a solenoid coil 12 of a suitable shape such as annulus is disposed to produce a static magnetic field applied in surrounding relation to the growing silicon single crystal 4.

The solenoid coil 12 is excited by a direct current (DC) and constitutes a static magnetic field applying means. The induction heating coil 5 and the solenoid coil 12 are vertically spaced by a predetermined distance. The static magnetic field thus formed acts on the molten zone and suppresses the convection in the molten zone 2.

The reduced step portion 25 may be formed on an upper side of the induction heating coil 5 for supporting thereon the solenoid coil 12, as shown in FIG. 3. In this instance, the solenoid coil 12 applies a static magnetic field to the polysilicon rod 1. The static magnetic field thus applied also acts on the molten zone 2 to such an extent that the magnetic field is effective to suppress the convection in the molten zone 2.

The invention will now be described by way of the following examples which should be construed as illustrative rather than restrictive.

EXAMPLE 1

Using the apparatus shown in FIG. 2 with a main portion shown on enlarged space in FIG. 1, an experiment was made with the conditions itemized as follows.

(1) Raw polysilicon rod 1: 100 mm in diameter, made from trichlorosilane, and having an average grain length of 10 to 1000 μm (2) Seed crystal 23: crystal orientation <111>

(3) Rotation rate of raw polysilicon rod 1: 0.4 r.p.m.

(4) Rotation rate of silicon single crystal 4: 6 r.p.m.

(5) Moving speed of raw polysilicon rod 1 and silicon single crystal 4 relative to induction heating coil 5: 3.0 mm/min (6) Solenoid coil 12: 210 mm inside diameter, 500 mm in outside diameter and 130 mm in height (7) Static magnetic field: vertical magnetic field of 700 gauss (8) Distance between induction heating coil 5 and solenoid coil 12: 175 mm (9) Post-heating: tubular reflector 13 disposed below induction heating coil 5 with a distance of 25 mm and laminate on its inside surface with a 115 mm-inside-diameter, 400 mm-length tubular silver plate Under the conditions described above, a silicon single crystal having a diameter of 80 mm (Crystal orientation: <111>, Conductivity type: phosphorus-doped n-type) was produced by a one-pass zoning of the FZ method (dislocation-free zoning only). The yield {(total weight of single crystal/total weight of raw polysilicon rod)×100} in this process was 73.2%.

From the results obtained in Example 1, it is confirmed that according to the method of the present invention, a polysilicon rod is converted into a silicon single crystal ingot by a one-pass zoning of the FZ method (dislocation-free zoning only), the resulting single crystal is excellent in quality, and the productivity of the FZ process is noticeably high.

Comparative Example 1

Using the same conditions as Example 1 except for omitting the static magnetic field, a silicon single crystal was grown only by a dislocation-free zoning process commonly employed in the conventional FZ method. The yield was 12.1%. It is obvious from the results of Comparative Example that a satisfactory single crystal cannot be grown by a one-pass zoning according to the conventional method.

In the embodiments described above, the static magnetic field is applied in surrounding relation to the silicon single crystal. The same result can be obtained when two vertically spaced solenoid coils 12 are disposed on opposite sides of the induction heating coil 5 so as to apply a vertical magnetic field to the molten zone 2. The vertical magnetic field and the horizontal magnetic field may be applied simultaneously.

As described above, the silicon single crystal growth method and apparatus according to the present invention can produce a silicon single crystal grown with high productivity by a one-pass zoning of the FZ method.

Obviously, various minor changes and modifications of the present invention are possible in the light of the above teaching. It is therefore to be understood that within the scope of the appended claims the invention may be practiced otherwise than as specifically described.

What is claimed is:

1. An apparatus for producing a silicon single crystal by a floating-zone method from a polysilicon rod having an average grain length of 10 to 1000 μm, said apparatus comprising:

means for heating a portion of the polysilicon rod to form a molten zone;

reflector means disposed around the silicon crystal ingot being grown and located near the molten zone for post-heating the growing silicon single crystal ingot;

means for applying a magnetic field of 300 to 1000 gauss to the molten zone; and means for passing the molten zone through the length of the polysilicon rod, thereby converting the polysilicon rod into a silicon single crystal ingot through a one-pass zoning of the floating zone method.

2. An apparatus according to claim 1, wherein said magnetic field applying means is disposed on at least one of opposite sides of the molten zone as viewed from a direction of growth of the silicon single crystal.

3. An apparatus according to claim 2, wherein said magnetic field is a static magnetic field acting in a direction perpendicular to the direction of growth of the silicon single crystal.

4. An apparatus according to claim 2, wherein said magnetic field is a static magnetic field acting in a direction parallel to the direction of growth of the silicon single crystal.

5. An apparatus according to claim 2, wherein said magnetic field applying means is a solenoid coil excitable with a direct current.

6. An apparatus according to claim 5, wherein said solenoid coil forms a static magnetic field acting on the molten zone in a direction perpendicular to the direction of growth of the silicon single crystal.

7. An apparatus according to claim 5, wherein said solenoid coil forms a static magnetic field acting on the molten zone in a direction parallel to the direction of growth of the silicon single crystal.

8. An apparatus according to claim 2, wherein said magnetic field is a combination of a first static magnetic field applied in a direction parallel to the direction of growth of the silicon single crystal and a second static magnetic field applied in a direction perpendicular to the direction of growth of the silicon single crystal.

9. An apparatus according to claim 8, wherein each of said first static magnetic field and said second static magnetic field is produced by a solenoid coil excitable with a direct current.

\* \* \* \* \*